United States Patent
Yagi (10) Patent No.: US 6,459,391 B1
(45) Date of Patent: *Oct. 1, 2002

(54) HIGH SPEED VARIABLE LENGTH DECODING PROCESSOR

(75) Inventor: Osamu Yagi, Tokyo (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/482,704

(22) Filed: Jan. 13, 2000

(30) Foreign Application Priority Data

Jan. 14, 1999 (JP) .............................................. 11-007462

(51) Int. Cl.[7] .............................. H03M 7/40; H03M 7/00
(52) U.S. Cl. .......................... 341/67; 341/61; 341/106; 382/246
(58) Field of Search .......................... 341/67, 65, 106, 341/107, 61; 382/246, 232; 711/214

(56) References Cited

U.S. PATENT DOCUMENTS

| | | | | |
|---|---|---|---|---|
| 5,129,068 A | * | 7/1992 | Watanabe et al. ............ | 711/214 |
| 5,398,027 A | * | 3/1995 | Ooi .............................. | 341/67 |
| 5,557,271 A | * | 9/1996 | Rim et al. ...................... | 341/67 |
| 5,572,208 A | * | 11/1996 | Wu ............................... | 341/67 |
| 5,682,156 A | * | 10/1997 | Suda ............................ | 341/67 |
| 5,883,975 A | * | 3/1999 | Narita et al. ................. | 382/232 |
| 5,901,177 A | * | 5/1999 | Sohn ............................ | 341/61 |
| 6,009,205 A | * | 12/1999 | Yoshida ...................... | 382/246 |

* cited by examiner

Primary Examiner—Peguy Jeanpierre
Assistant Examiner—Jean Bruner Jeanglaude
(74) Attorney, Agent, or Firm—Sonnenschein, Nath & Rosenthal (57) ABSTRACT

A general-purpose processor performs high-speed variable-length decoding. The general-purpose processor includes a video data register for exclusively storing the variable-length code that stores data having a length larger than the maximum length of the variable code to be decoded. The general-purpose processor also includes a data counter register for exclusively storing the length of the data in the video data register which has not been decoded, as well as a pointer register for exclusively storing the address of the variable-length code to be read out next from a bit stream stored in memory. The general-purpose processor also includes an ALU for performing general purpose operations, and decodes the variable-length code stored in the video data register by controlling the video data register, the data counter register, and the pointer register.

17 Claims, 5 Drawing Sheets

show_bits()

flush_buffer()

HIGH SPEED VARIABLE LENGTH DECODING PROCESSOR

BACKGROUND OF THE INVENTION

1. Field of the Invention

This invention relates to an operation unit, and more particularly to an operation unit which is capable of high-speed variable-length decoding in, for example, a general-purpose processor.

2. Description of Related Art

Figure 4:
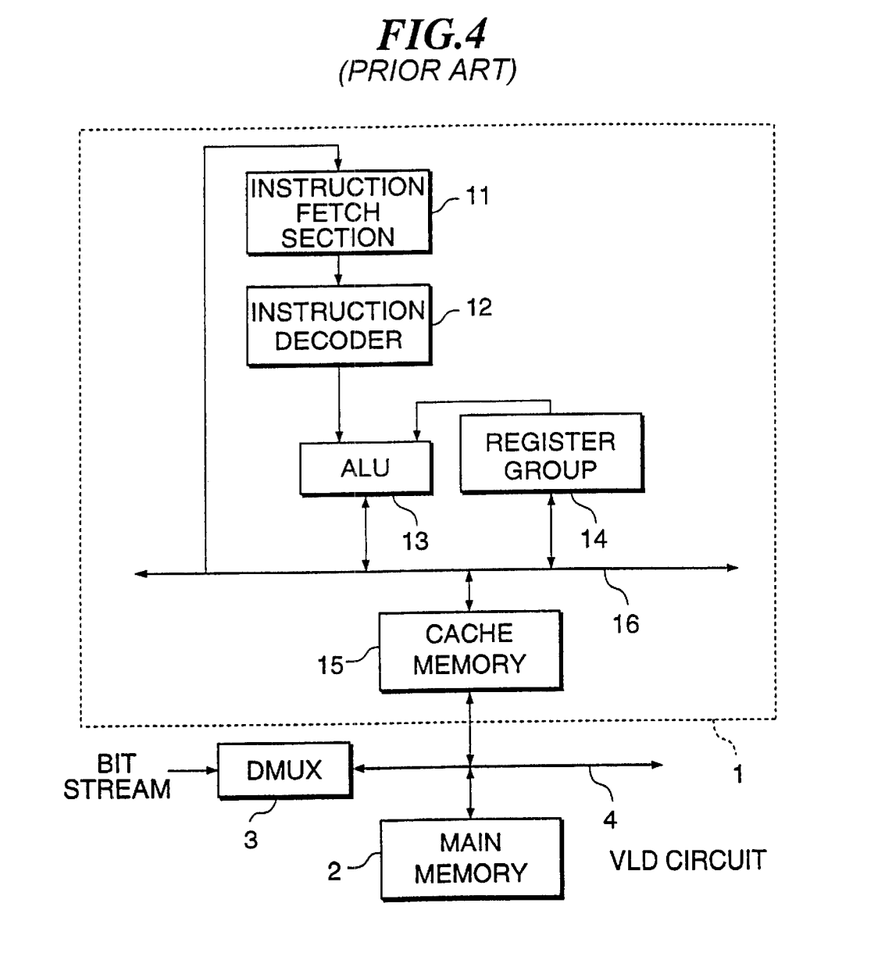
FIG. 4 is a block diagram for illustrating an exemplary structure of a conventional VLD circuit.

FIG. 4 shows an exemplary structure of a conventional VLD (variable-length decoding) circuit which utilizes a general-purpose processor.

For example, a transport system based on MPEG-2 (Moving Picture Experts Group) is supplied to a DMUX (demultiplexer) 3, and the DMUX 3 separates the elementary stream of a video and audio from the transport stream. A video elementary stream obtained in the DMUX 3 is supplied to a main memory 2 through a bus 4 and stored in a main memory 2.

The main memory 2 stores the video elementary stream supplied from the DMUX 3 as described herein above and has a stored program for operating a general-purpose processor 1 as a VLD circuit, and the general-purpose processor 1 decodes a variable-length code stored in the main memory 2 by operating the program stored in the main memory 2.

In detail, the general-purpose processor 1 comprises an instruction fetch section 11, an instruction decoder 12, and an ALU (Arithmetic Logic Unit) 13, a register group 14, a cache memory 15, and an internal bus 16, and the program stored in the main memory 2 is supplied to the cache memory 15 through the bus 14 occasionally and stored therein.

The instruction fetch section 11 suitably fetches a command (instruction) which constitutes the program stored in the cache memory 15 and supplies it to the instruction decoder 12. The instruction decoder 12 decodes a command supplied from the instruction fetch section 11 and supplies the decoded result to the ALU 13. The ALU 13 performs various general processes as required according to the decoded result supplied from the instruction decoder 12 while reading and writing the data from and in the register group 14.

In detail, the main memory 2 has the stored program used for variable-length decoding, and the ALU 13 performs processes required for variable-length decoding.

In detail, a video elementary stream stored in the main memory 2 is occasionally transferred to the cache memory 15 through the bus 4 and stored therein. The video elementary stream stored in the cache memory 15 is occasionally transferred to the register 14 through the internal bus 16 and stored therein, and subjected to variable-length decoding in the ALU 13.

The register group 14 comprises, for example, a plurality of 32 bit registers, and in the ALU 13, any one of these registers is assigned to the buffer Bfr (video stream data buffer) which stores a variable-length code to be subjected to variable-length decoding out of variable-length codes which are components of the video elementary stream (therefore, the buffer Bfr is 32 bits), and the data stored in the buffer Bfr is subjected to general-operation corresponding to functions such as show_bits(), get_bits(), and flush_buffer() to perform variable-length decoding.

The function show_bits (int N) is for observing N bits from MSB (Most Significant Bit) of the buffer Bfr, and described as shown herein under, for example, in C language. unsigned mnt show_bits(int N)
{
return Bfr>>(32-N)
}

Figure 5A:
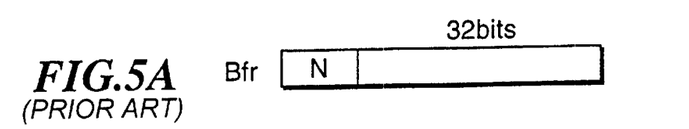
FIG. 5A to FIG. 5C are diagrams for describing the process performed by the function show_bits().
Figure 5B:
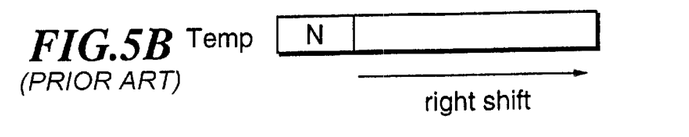
Figure 5C:
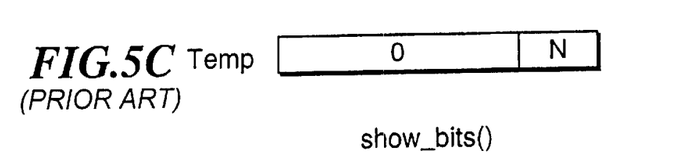

According to the function show_bits (int N), the content of the buffer Bfr that is one register of the register group 14 as shown in FIG. 5A is copied in another register (temporary register) Temp of the register group 14, and shifted to the right by 32-N bits (Bfr>>(32-N)). As the result, N bits are set from MSB of the buffer Bfr to lower N bits of the register Temp as shown in FIG. 5C, and this is returned as the functional value of the function show_bits (int N) (return Bfr>>(32-N)). In this case, the stored value of the buffer Bfr is not changed.

In the case that higher N bits of the buffer Bfr observed in the function show_bits() and get_bits() are discarded and the number of bits of the stored value of the buffer Bfr that remains residual after discarding is equal to or smaller than the maximum length of the variable-length code, the function flush_buffer (int N) reads the subsequent data from the cache memory 15 for supplement, for example, it is described as shown herein under in C language:

void flush_buffer (int N) {
Bfr<<=N;
Incnt-=N;
if (Incnt<=24){
   do{
      bfr |=*Rdptr++<<(24-Incnt);
      Incnt+=8;
   } while (Incnt<=24);
} else {
   . . .
}
}

The variable Rdptr is a pointer to the address (position) of a variable-length code to be read out next in the video elementary stream stored in the cache memory 15, one of the registers which are components of the register group 14 is assigned to the variable Rdptf. The variable Incnt is a variable for storing the length of the data which has not been subjected to variable-length decoding out of the data stored in the buffer Bfr, one of the registers which are components of the register group 14 is assigned to the variable Incnt.

Figure 6A:
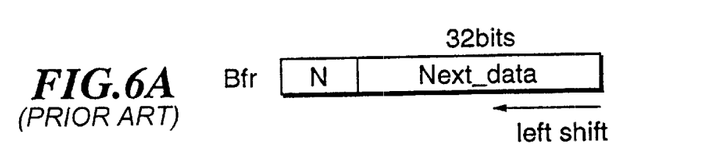
FIG. 6A to FIG. 6D are diagrams for describing the process performed by the function flush_buffer().
Figure 6B:
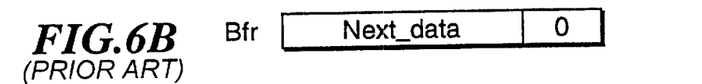

According to the function flush_buffer (int N), as shown in FIG. 6A, when variable-length decoding of the higher N bits of the buffer Bfr is completed, the stored value of the buffer Bfr is bit-shifted to the left by N bits (Bfr<<=N), and as the result the stored value of the buffer Bfr is changed as shown in FIG. 6B.

The variable Incnt is decremented by N, and the variable Incnt is changed so as to indicate the length of the data (portion described as Next_data in FIG. 6B and FIG. 6D) which has not been subjected to variable-length decoding after the stored value of the buffer Bfr is left-shifted by N bits as shown in FIG. 6B.

Furthermore, in the case that the variable Incnt after changing is equal to or shorter than the maximum length (herein, for example, 24 bits) of the variable-length code (if (Incnt <=24), stuffing process is performed, that is, the data subsequent to the data which has not been subjected to variable-length decoding stored in the buffer Bfr is read out from cache memory 15 and supplemented until the variable Incnt exceeds 24 bits, namely the maximum length of the variable-length code (while (Incnt<=24)).

In detail, the pointer Rdptr is incremented by 1 (Rdptr++), and the data (which is the component of the video elementary stream) stored at the address pointed to by the pointer is read out from the cache memory 15. Herein it is assumed that, for example, 8-bit data is stored at the address of the cache memory 15 which is pointed to by the pointer Rdptr. The 8-bit data stored at the address pointed to by the pointer Rdptr is read out from the cache memory 15.

Figure 6C:
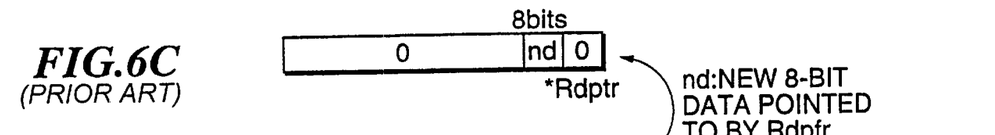

The 8-bit data nd (represented by Rdptr) read out from the cache memory 15 is stored in the lower 8 bits of one of the registers which are components of the register group 14 through the internal bus 18. The ALU 13 reads out the stored value of the register where the 8-bit data nd is stored, and shifts to the left by 24-Incnt bits as shown in FIG. 6C (Rdptr++<<(24-Incnt)).

Figure 6D:
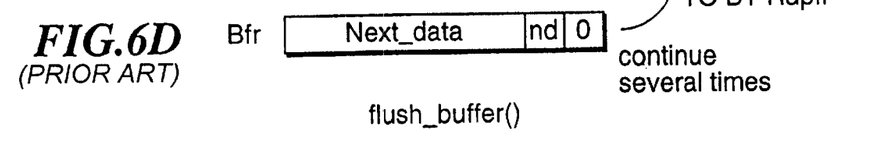

Furthermore, the ALU 13 operates OR (referred to as bit OR suitably) for each bit of the bit shift result (FIG. 6C) and the stored value (FIG. 6B) of the buffer Bfr, and stores the operation result in the buffer Bfr (bfr |=Rdptr++<<(24-Incnt)) as shown in FIG. 6D. As the result, the data (FIG. 6D) formed by supplementing the data (FIG. 6B) which has remained residual after the higher N bits of the original stored value (FIG. 6A) has been discarded and which has not been subjected to variable-length decoding with the subsequent 8-bit data is stored in the buffer bfr.

The ALU 13 increments the variable Incnt which represents the length of the data which has not been subjected yet to variable-length decoding out of the data stored in the buffer Bfr by 8 namely the data quantity of the data nd (Incnt +=8), and the above-mentioned stuffing process (process for supplementing the buffer Bfr with the data in 8-bit units) is repeated until the variable Incnt exceeds 24 bits namely the maximum length of the variable-length code (while (Incnt<=24)).

The function get_bits (int N) performs the process which corresponds to both functions show_bits() and flush_buffer(), and is described as shown herein under in, for example, C language:

```
unsigned int get_bits (int N)
{
    unsigned int Val;
    Val=show_bits (N);
    flush_buffer (N);
    return Val;
}
```

In the above-mentioned conventional VLD circuit, because the register group 14 comprises general-purpose registers which the ALU 13 for general-purpose operation uses for operation, it is difficult to perform high-speed VLD processing.

SUMMARY OF THE INVENTION

The present invention was accomplished to solve the problem, it is the object of the present invention to provide an operation unit which is capable of high-speed VLD processing in a general-purpose processor.

An operation unit for general-purpose operation comprising a general-purpose storage means for storing the data for the general-purpose operation, a variable-length code storage means for exclusively storing a variable-length code capable of storing the data having the length equal to or longer than the maximum length of the variable-length code to be subjected to variable-length decoding, a length storage means for exclusively storing the length of the data not subjected to variable-length decoding out of the data stored in the variable-length code storage means, a position storage means for exclusively storing the position of the variable-length code to be read out next in a bit stream of the variable-length code, and an operation means for the general-purpose operation for variable-length decoding the variable-length code stored in the variable-length code storage means by controlling the variable-length code storage means, length storage means, and position storage means.

In the operation unit having the above-mentioned structure, the general-purpose storage means stores the data for performing general-purpose operation. The variable-length code storage means is exclusively served for storing a variable-length code which is capable of storing the data having the length equal to or longer than the maximum length of the variable-length code to be subjected to variable-length decoding, and the length storage means is served for storing the length of the data which has not been subjected to variable-length decoding out of the data stored in the variable-length code storage means. The position storage means is served for exclusively storing the position of the variable-length code to be read out next out of codes of a variable-length code bit stream, and the operation means is served for performing general-purpose operation to variable-length decode the variable-length code stored in the variable-length code storage means by controlling the variable-length code storage means, length storage means, and position storage means.

DETAILED DESCRIPTION OF THE PREFERRED EMBODIMENTS

Figure 1:
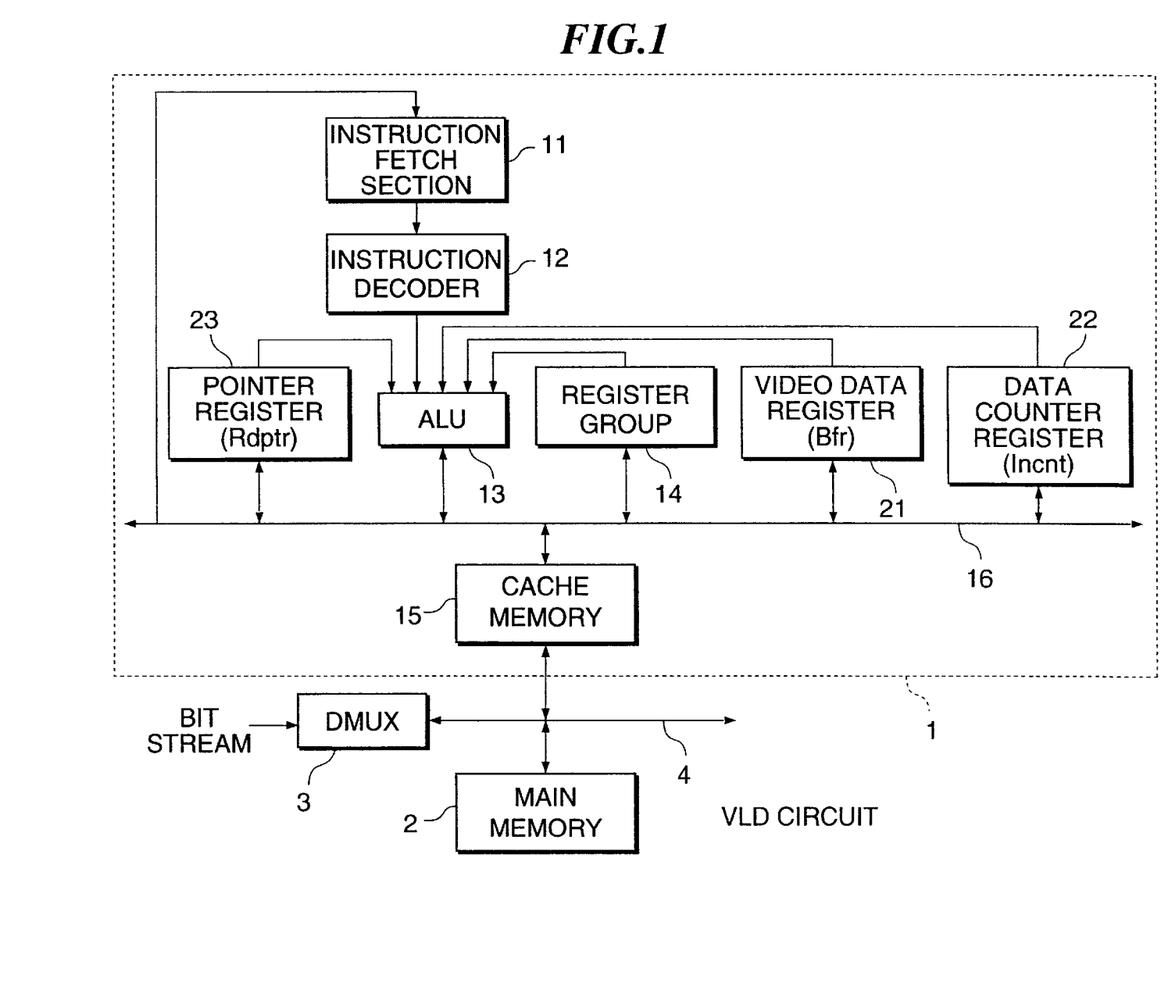
FIG. 1 is a block diagram for illustrating an exemplary structure of an embodiment of a VLD circuit to which the present invention is applied.

FIG. 1 is an exemplary structure of an embodiment of a VLD circuit to which the present invention is applied. The same components as shown in FIG. 4 are given the same characters as given in FIG. 4, and the description is omitted hereinafter. In detail, the VLD circuit shown in FIG. 1 comprises a general-purpose processor 1, a main memory 2, a DMUX 3, and a bus 4, and has the same structure as shown in FIG. 4 basically.

However, the general-purpose processor 1 is provided with a video data register 21 for storing predetermined exclusive data (variable-length code storage means), a data counter 22 (length storage means), and a pointer register 23 (position storage means) in addition to the register group 14 (general-purpose storage means) for storing the data for general-purpose operation.

The video data register 12 is to be assigned to the above-mentioned buffer Bfr, and structured so as to be a register for exclusively storing the variable-length code read out from the cache memory which is to be subjected to variable-length decoding by the ALU 13. The video data register 21 stores more data than each register which is a component of the general-purpose register group 14, namely the data of more than 32 bits, for example 64-bit data.

The data counter register 22 is to be assigned to the above-mentioned variable Incnt, and structured so as to be a register for exclusively storing the value which the variable Incnt has to hold.

The pointer register 23 is to be assigned to the above-mentioned pointer Rdptr, and is structured to be an register for exclusively storing the address (position) of the cache memory which the pointer Rdptr points to.

In the ALU 13 (operation means), the process corresponding to the above-mentioned functions show_bits(), get_bits (), and flush_buffer() is performed while these exclusive video data register 21 (Btr), the data counter register 22 (Incnt), and the pointer register 32 (Rdptr) are being controlled, and the variable-length code stored in the video data register 21 is subjected to variable-length decoding.

Because the video data register 21 can store the data of more bits, namely 64 bits, than each register of the general-purpose register group 21, the number of stuffing process as described herein above is reduced during the processing of the function flush_buffer(), and as the result the high-speed variable-length decoding process can be realized.

In detail, in the case that one of the registers of the register group 14 is assigned to the buffer Bfr, the data length of the buffer Bfr is equal to the data length of the register group 14, namely 32 bits. It is assumed that the variable-length code which has not been subjected to variable-length decoding (accordingly, the variable-length code of 32 bits) is stored in the whole buffer Bfr, such buffer is subjected to variable-length decoding, and variable-length decoding of the higher N bits is completed. In this case, the data which has not been subjected to variable-length decoding has 32-N bits, this number of bits is likely to be equal to or less than 24 bits namely the maximum length of the variable-length code (because N ranges from 1 bit to 24 bits, namely the maximum length of the variable-length code), as the result in the function flush_buffer(), the number of stuffing process (data transfer process for the cache memory to the buffer Bfr) is repeated many times. As the result of repetition of stuffing process performed many times, it takes a long time to complete the whole process of variable-length decoding.

On the other hand, in the case that the large-sized video register 21 for storing the variable-length code is provided additionally to the general-purpose register group 14, the data length of the buffer Bfr is equal to the data length of the video register 21 namely 64 bits. Similarly to the above-mentioned case, it is assumed that the variable-length code which has not been subjected to variable-length decoding (accordingly, the variable-length code of 64 bits) is stored in the whole buffer Bfr, such buffer is subjected to variable-length decoding, and variable-length decoding of the higher N bits is completed. In this case, the data which has not been subjected to variable-length decoding has 64-N bits, the maximum value of N is the maximum length of the variable-length code namely 24 bits, and 64-N will be therefore larger than 24. As the result, the number of repetition of stuffing process is reduced, and high-speed variable-length decoding process is realized (short time).

Next, it is made possible to provide an exclusive command (function) for performing high-speed process, which is employed for so-called incorporated microcomputer, by providing the exclusive video data register 21 served as the buffer Bfr.

To take the advantage, a function vld_bit_ext (int N) which can extract the higher N bits of the buffer Bfr without copying the content of the buffer Bfr is provided in the temporary register Temp (FIG. 5) instead of the above-mentioned function show_bits (int N). According to the function vld_bit_ext (int N), because it is not required to copy the content of the buffer Bfr, the higher N bits of the buffer Bfr can be extracted in one step, as the result, the higher speed variable-length decoding process is realized.

Next, in the case of the VLD circuit shown in FIG. 1, in the function flush_buffer(), the number of repetition of stuffing process is reduced, but still some number of repetition of stuffing process is required. In stuffing process, the data pointed to by the pointer Rdptr (Rdptr) is bit-shifted as described herein above, and bit unit OR of the bit shift result and the stored value of the buffer Bfr is operated, and at that time it takes a long time to complete bit shifting and operation of the bit unit OR in the case that a general-purpose ALU 13 is used.

Figure 2:
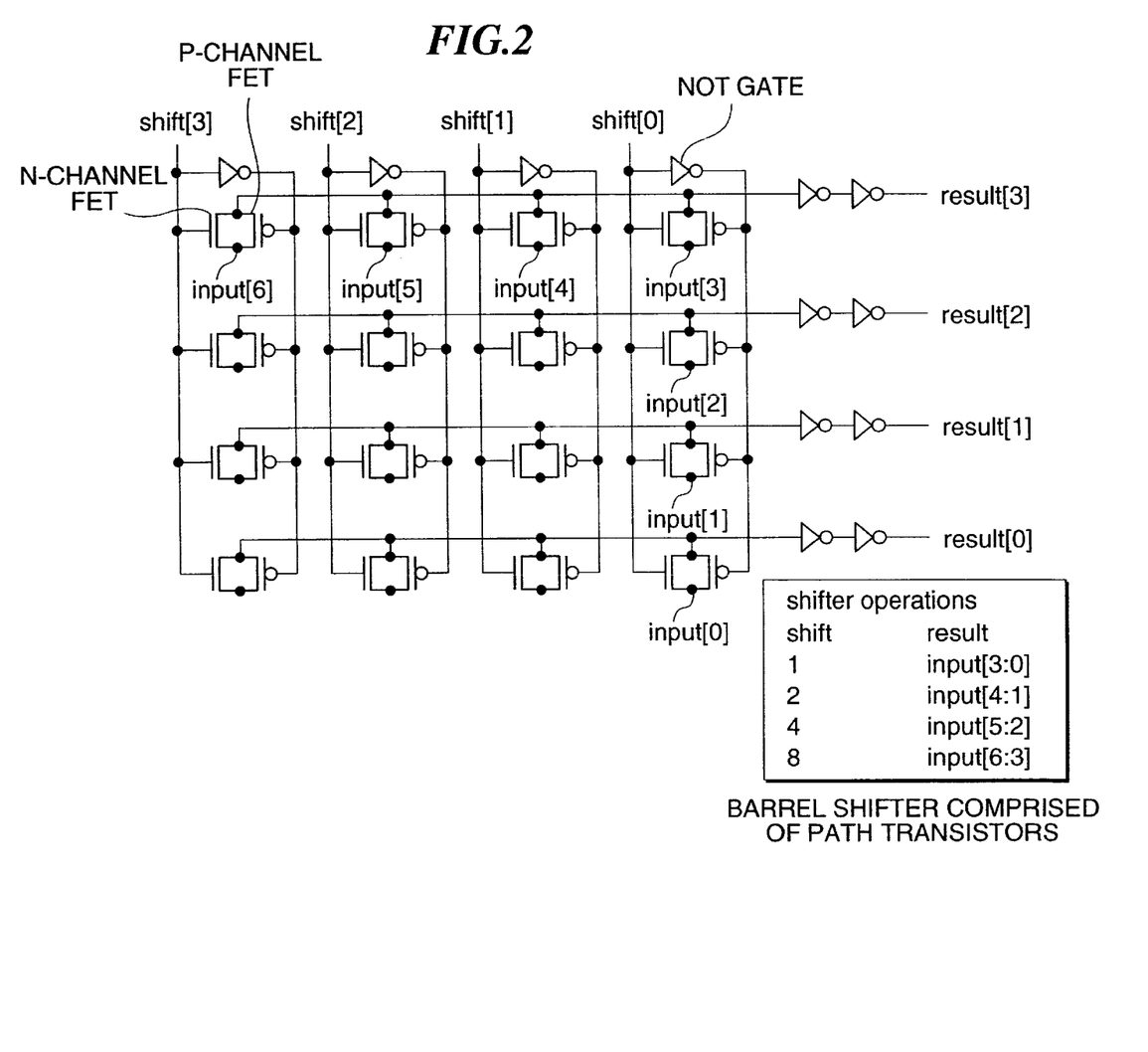
FIG. 2 is a circuit diagram for illustrating an exemplary structure of a barrel shifter comprising path transistors mounted on the ALU 13 shown in FIG. 1.

To solve the above-mentioned problem, in the present invention, for example, a barrel shifter having the same structure as the barrel shifter comprising path transistors as shown in FIG. 2 is incorporated in the ALU 13.

In FIG. 2, a latticed circuit formed by connecting sources or drains of N-channel FETs (field effect transistor) to drains or sources of P-channel FETs respectively is provided, and a predetermined bit out of the input[ ] to be bit-shifted is supplied to the connection point of the source of an N-channel EFT and the drain of a P-channel FET.

A predetermined bit of the four bit output data result[ ] obtained as the result of bit shifting of the input data input[ ] is generated from the connection point of the drain of the N-channel FET and the source of the P-channel FET of the latticed circuit.

A predetermined bit of a four bit shift quantity data shift[ ] for indicating the number of bit to be shifted is supplied to gates of the N-channel FETs and P-channel FETs.

In the barrel shifter shown in FIG. 2, 4-bit output data result[3] to result[0] is generated as the bit shift result instead of 7 bit input data input[6] to input[0] (input[i] represents bits from LSB (Least Significant Bit) to (i-1)-th bit), in this case the number of bits to be shifted is determined based on the shift quantity data shift[3] to shift[0].

In detail, in the case that the first bit shift[0] is 1 and other bits are 0 in the shift quantify data shift[ ], the first bit to the fourth bit input[3:0] of the input data input[ ] are generated as the output data result[ ]. Accordingly, no bit shifting is performed in this case.

In the case that the second bit shift[1] (second bit from LSB) out of the shift quantity data shift[ ] is 1 and other bits are 0, the second bit to the fifth bit input[4:1] of the input data input[ ] are generated as the output data result[ ]. Accordingly, 1 bit right shifting is performed in this case.

In the case that the third bit shift[1] (third bit from LSB) out of the shift quantity data shift[ ] is 1 and other bits are 0, the third bit to the sixth bit input[5:2] of the input data input[ ] are generated as the output data result[ ]. Accordingly, 2 bit right shifting is performed in this case.

In the case that the fourth bit shift [1] (fourth bit from LSB) out of the shift quantity data shift[ ] is 1 and other bits are 0, the fourth bit to the seventh bit input[6:3] are generated as the output data result[ ]. Accordingly, 3 bit right shifting is performed in this case.

According to the barrel shifter comprising path transistors as described herein above, high-speed bit shifting is realized.

Figure 3A:
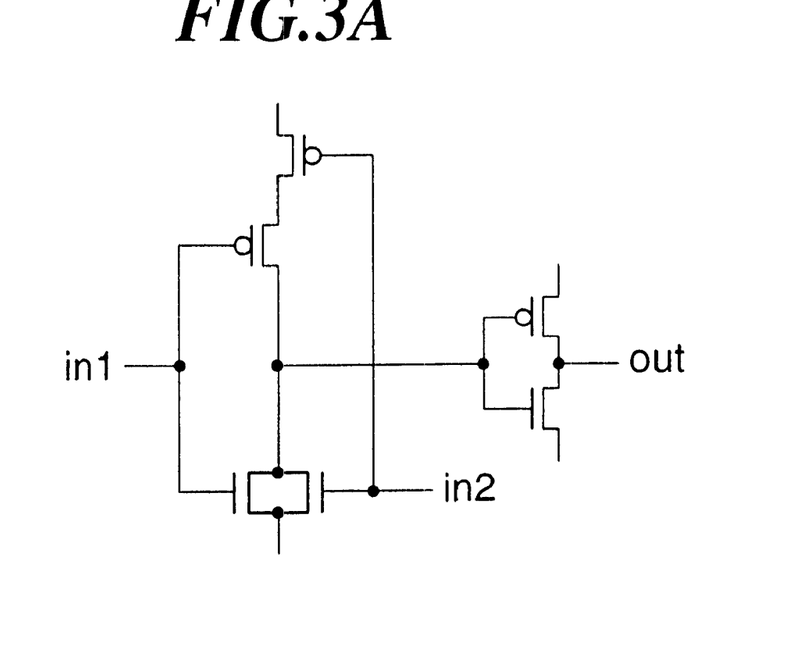
FIG. 3A and FIG. 3B are circuit diagrams for illustrating exemplary structures of circuits for operating OR mounted on the ALU 13 shown in FIG. 1.
Figure 3B:
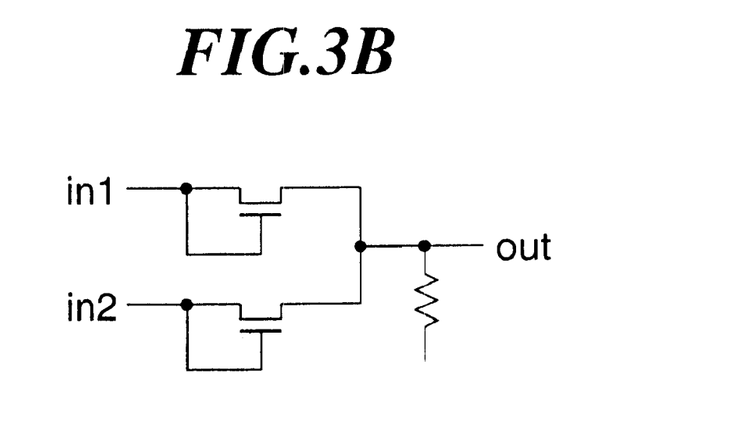

Next, in the ALU 13, a general-purpose circuit comprising 6 FETs, for example, as shown in FIG. 3A may be incorporated as the circuit for operating the bit unit OR, but in the case that bit unit OR is operated, because it is only the requirement to generate an output which indicates that any one of 2 input signals in1 and in2 is a H (High) level signal, a circuit comprising path transistors may be incorporated in the ALU 13 as the circuit for operating bit unit OR as shown in FIG. 3B. In this case, a circuit for operating the bit unit OR can comprise two FETs, four fewer than the implementation shown in FIG. 3A, and the OR can be obtained at higher speed.

It is made possible to perform bit shifting and bit unit OR operation in one step by incorporating (mounting) a barrel shifter comprising path transistors and a circuit for operating OR as described herein above in the ALU 13. Herein, a function for performing bit shifting and bit unit OR operation in one step is defined as vld_1s_bor (int N), then it is made possible to perform stuffing process performed in the function flush_buffer() in a short cycle by using the function vld_1s_bor (int N). As the result, execution cycle required for variable-length decoding process is shortened the more.

Because the general-purpose processor 1 shown in FIG. 1 comprises the general-purpose processor, the video data register 21, the data counter 22, and the pointer register 23, which are exclusively used for variable-length decoding process, and the ALU 13 comprising the barrel shifter having path transistors or the circuit for operating OR as shown in FIG. 2 or FIG. 3 respectively, the general-purpose processor 1 can be used not only for high-speed variable-length decoding process as described herein above but also for general-purpose operation as in the conventional use (a processor excellent not only in general-purpose operation but also in media processing (herein, variable-length decoding process) is called as media processor).

The size of a video data register 21 is 64 bits in the present invention, but the size of the video data register is by no means limited to 64 bits. Basically, the larger the size is, the more effectively the number of repetition of stuffing process is reduced.

What is claimed is:

1. In a general purpose processor including a register group comprising a plurality of n-bit registers, a variable length decoding circuit for decoding a variable-length code, the decoding circuit comprising:
   a code data register for storing a portion of variable-length coded data, the code data register longer than n-bits and at least as long as a maximum coding length characterizing the variable-length code;
   a data count register for storing a data length representing an amount of the portion of variable-length coded data not yet decoded;
   a pointer register for storing a memory location from which to next read additional variable-length coded data into the code data register; and
   an ALU for decoding the portion of the variable-length coded data in the code data register.

2. The variable length decoding circuit of claim 1, further comprising
   a memory for storing variable-length coded data characterized by the maximum coding length.

3. The variable length decoding circuit of claim 1, wherein the code data register exclusively stores portions of the variable-length coded data.

4. The variable length decoding circuit of claim 1, wherein the data count register exclusively stores data lengths representing amounts of the portions of variable-length coded data not yet decoded.

5. The variable length decoding circuit of claim 1, wherein the pointer register exclusively stores positions in memory from which to next read additional variable-length coded data into the code data register.

6. The variable length decoding circuit of claim 1, further comprising a barrel shifter coupled to the ALU.

7. The variable length decoding circuit of claim 6, wherein said ALU includes a logic-OR circuit comprising path transistors.

8. The processor of claim 1, further comprising a cache memory for storing variable-length coded data characterized by the maximum coding length.

9. A processor for decoding a variable-length code characterized by a maximum coding length, the processor comprising:
   an instruction fetch section;
   an instruction decoder;
   a register group comprising a plurality of n-bit general purpose registers;
   a code data memory means for storing a portion of variable-length coded data, the code data memory means greater in capacity than n-bits and at least as great in capacity as the maximum coding length;
   a data count register for storing a data length representing an amount of the portion of variable-length coded data not yet decoded;
   a pointer register for storing a memory location from which to next read additional variable-length coded data into the code data register; and
   a decoding means for decoding the portion of the variable-length coded data in the code data register.

10. The processor of claim 9, wherein the pointer register exclusively stores positions in memory from which to next read additional variable-length coded data into the code data register.

11. The processor of claim 9, wherein the data count register exclusively stores data lengths representing amounts of the portions of variable-length coded data not yet decoded.

12. The processor of claim 9, wherein the code data memory means comprises a code data register for exclusively storing portions of the variable-length coded data.

13. In a general purpose processor including a register group comprising a plurality of n-bit registers, a method for variable length decoding, the method comprising:
   storing, in a code data register, a portion of variable-length coded data, the code data register longer than n-bits and at least as long as a maximum coding length characterizing the variable-length code;
   storing, in a data count register, a data length representing an amount of the portion of variable-length coded data not yet decoded;
   storing, in a pointer register, a memory location from which to next read additional variable-length coded data into the code data register; and
   decoding the portion of the variable-length coded data in the code data register.

14. A method according to claim 13, wherein storing a data length comprises storing a data length exclusively in the data count register during decoding.

15. A method according to claim 13, wherein storing a memory location comprises storing a memory location exclusively in the pointer register during decoding.

16. A method according to claim 13, wherein decoding includes barrel shifting and performing a logical-OR operation.

17. A method according to claim 13, wherein storing a portion of variable length coded data comprises storing a portion of variable length coded data exclusively in the code data register during decoding.

* * * * *